United States Patent [19]

Knudsen

[11] Patent Number: 5,015,876
[45] Date of Patent: May 14, 1991

[54] HIGH SPEED CHARGE-COUPLED SAMPLER AND RATE REDUCTION CIRCUIT

[75] Inventor: Knud L. Knudsen, Mountain View, Calif.

[73] Assignee: Hewlett-Packard Company, Palo Alto, Calif.

[21] Appl. No.: 375,238

[22] Filed: Jun. 30, 1989

[51] Int. Cl.⁵ .................... H03K 17/04; H03K 17/56; G11C 27/02
[52] U.S. Cl. .................................... 307/352; 357/24; 377/61
[58] Field of Search ................. 307/352, 353; 377/60, 377/61, 62, 63; 357/24

[56] References Cited

U.S. PATENT DOCUMENTS

| 4,099,197 | 7/1978 | Ibrahim et al. | 357/24 |
| 4,123,733 | 10/1978 | Poirier | 357/24 |
| 4,210,825 | 7/1980 | Crochiere et al. | 377/61 |
| 4,259,598 | 3/1981 | Tiemann et al. | 357/24 |

Primary Examiner—John Zazworsky

[57] ABSTRACT

A high speed charge-coupled sampler and rate reduction circuit is disclosed. The present invention allows measurement of high frequency input signals while reducing actual data rates for a series of accurately interleaved sampler data streams. The charge-coupled sampler includes a source means for providing a steady supply of charge and a sampling gate means adjacent to the source means for dividing the charge stream into discrete charge packets separated uniformly in time. An input gate means, adjacent to the sampling gate means, modulates the discrete charge packets, such that size of each charge packet is directly proportional to the instantaneous voltage applied to the input gate means. A plurality of sequential charge output means in turn surround and are adjacent to the input signal gate means. Each sequential charge output means comprises a transfer gate and a storage gate for transferring and storing the charge packet modulated by the input gate means. Once a charge packet is stored by storage gate, it is available for further processing as part of that particular data stream. By interleaving the data streams from all sequential charge output means, the original input signal may be reconstructed. The high speed charge-coupled sampler and rate reduction circuit disclosed and claimed in this patent application provides an advanced, highly accurate and compact instrument for high frequency data acquisition and processing.

8 Claims, 6 Drawing Sheets

HIGH SPEED CHARGE-COUPLED SAMPLER AND RATE REDUCTION CIRCUIT

BACKGROUND OF THE INVENTION

The present invention is a method and apparatus for sampling high-speed electrical waveforms. Commercial and research demands for high-speed digital waveform acquisition and analysis have increased dramatically, outstripping current capability for measuring and processing such rapid streams of data. Digital signal analysis comprises sampling a time-varying waveform at discrete intervals, measuring those samples, either in voltage or current and processing the samples. With almost no exception, digital analysis requires samples taken at uniform time intervals; any non-uniformity results in undesirable spectral components centered around subharmonics of the sampling frequency. Since such distortions of the input data cannot be readily corrected, a useful sampler must offer some guarantee of performing uniform sampling of data.

At very high sampling rates, however, further processing of the data stream becomes difficult. Computational power ordinarily cannot keep up with signal frequencies in the gigahertz range. Slower processing requirements make some form of a rate reduction scheme inportant for a high-speed sampling system. Using several interleaved samplers, each sampler operating at a fraction of the overall system sampling frequency, one can achieve a high sampling rate while concurrently reducing each data stream rate to within conventional processing abilities. However, an interleaved sampling system magnifies the problem of timing uniformity error, due to the difficulty of accurately interleaving the separate sampling streams.

Using one first rank sample-and-hold circuit, implemented in Gallium Arsenide (Ga-As) bipolar technology, and demultiplexing its output into several second rank sample-and-hold circuits does offer uniform sampling and has been demonstrated at a 1 gigahertz sampling frequency. Poulton, Corcoran & Hornak, *A 1 GHz 6-bit ADC System*, SC-22 IEEE J. Solid-State Circuits No. 6, 962–970 (1987).

Charge-coupled devices allow sampling at even higher rates, higher than any other known electric circuit. However, further processing at this high rate again becomes extraordinarily difficult if not impossible, without some form of interleaving of samplers.

As discussed in Howes & Morgan, *Charge-Coupled Devices and Systems*, John Wiley & Sons, 1979, a charge-coupled device (CCD), in its simplest form, comprises an array of closely spaced Metal Oxide Semiconductor (MOS) capacitors. FIGS. 1 and 2 reveal a three-phase, two bit, n-channel CCD. The six MOS capacitors or electrodes connected to $\phi_1$, $\phi_2$, and $\phi_3$ clock lines form the main body of the CCD while the input diode (ID), the input gate (IG), the output diode (OD), and the output gate (OG) form the input and output structure that injects and detects charge packets to and from the main CCD body. The p+ diffusion that surrounds the active area prevents a charge carrier inversion in the p-type silicon substrate. The device can be considered as a multi-gate MOS transistor.

The operation of the device can be explained with the aid the FIGS. 3 and 4, which show the various clock waveforms and the potential and charge distribution inside the device. At $t=t_1$, $\phi_1$ is at a high voltage (greater than the threshold voltage) while both $\phi_2$ and $\phi_3$ are at a low voltage. Both the input diode and the output diode are biased with high positive voltages to prevent the inversion of the surface under the input gate and the output gate. Therefore, the surfaces under the input and the output gates are in deep depletion and the input and the output diodes cannot supply electrons into the main CCD array. As a result, the six MOS capacitors are also in deep depletion and the surface potential is determined by the voltages applied to the electrodes. Surface potential is approximately linearly related to the gate voltage for an MOS capacitor in deep depletion with no mobile electrons at the surface. The surface potential under the $\phi_1$ electrodes, therefore, will be higher than that under the $\phi_2$ and $\phi_3$ electrodes. If the distance between the electrodes, the gap length, is sufficiently small, the transition from the high surface potential under a $\phi_1$ electrode to the low surface potential under a $\phi_2$ or $\phi_3$ electrode will be smooth. This creates energy wells under the $\phi_1$ electrodes as shown in FIG. 4. If the device stays in this condition for a long time, thermally generated electrons will be collected in the energy wells, forming charge packets stored in confined regions under $\phi_1$ electrodes. In normal operation of a CCD, however, the clock frequency is sufficiently high for the number of thermally generated electrons to be negligible compared with the signal charge.

The signal charge is injected into the device at $t=t_2$. At this time, the voltage of the input diode is lowered to a value between the surface potentials under the input gate and the $\phi_2$ electrode. Electrons find regions of higher potential and flow into the energy well under the $\phi_1$ electrode through the input gate. At the end of this injection, the surface potentials under the input gate and the first $\phi_1$ electrode will be the same as the input diode voltage. Electrons are now stored under the input gate and the first $\phi_1$ electrode.

At $t=t_3$, the voltage of the input diode is returned to a high value and the electrons under the input gate as well as the excess electrons under the first $\phi_1$ electrode will be taken out of the device through the input diode lead. This creates a well-defined charge packet under the first $\phi_1$ electrode. The size of the charge packet is proportional to the difference between the surface potential under the input gate and that of the first $\phi_1$ electrode. If the surface potential of the first $\phi_1$ electrode is carefully controlled, its charge packet represents a sample corresponding to the input voltage applied to the Input gate.

At $t=t_4$, the voltage applied to the $\phi_1$ electrodes returns to the low value while the $\phi_2$ electrodes have high voltage applied to them. The charge packet stored under the first $\phi_1$ electrode moves to the first $\phi_2$ electrode because the surface potential under the first $\phi_2$ electrode is now higher. This process is called charge transfer. At $t=t_5$, the charge-transfer process is completed and the charge packet is now stored under the first $\phi_2$ electrode. This charge-transfer process is repeated and at $t=t_6$, the injected charge packet is stored under the second $\phi_3$ electrode. At $t=t_7$, the voltage of the $\phi_3$ electrodes returns to the low value and pushes the electron charge packet out to the output diode, providing an output signal proportional to the size of the charge packet and hence proportional to the input signal to the charge-coupled device.

While a charge-coupled device as described can comprise an extremely high speed digital sampling device, achieving sampling frequencies in excess of 1 gigahertz, no CCD device has demonstrated an interleaving of samples at such a high sampling rate. The electronic data acquisition and signal processing industry has faced a great challenge to produce a sampling circuit capable of both an extremely high base sampling frequency coupled with a method of interleaving separate samplers accurately, to reduce the rate for each separate data stream. The development of an improved data sampling circuit, capable of accurate interleaving at sampling rates in excess of one gigahertz, would represent a major technological advance. The precise and wide-bandwidth tracking of ultrahigh frequency signals such a sampler would allow would satisfy a long-felt need within the industry and offer to a large number of commercial and research users a versatile, faithful and inexpensive sampling and rate reduction circuit.

SUMMARY OF THE INVENTION

The high speed charge-coupled sampler and rate reduction circuit described in the present invention achieves extraordinarily high sampling rates of wide bandwidth signals. The sampler combines a method of interleaving a series of staggered samplings of the signal with a novel equilibration of each sampler to the current signal strength, making resetting of separate samplers unnecessary.

The present invention comprises a plurality of independent CCD samplers, or injectors, spaced closely around a means for providing an input signal to these injectors. A signal gate, which is essentially a diode, opens and closes and allows the input signal to flow to the injectors at the clock frequency of the sampler. The preferred embodiment of the present invention samples signals at a 4 gigahertz rate. Each CCD injector or gate, however, releases only its proportionate share of the input signal. If there are four injectors, the device interrogates a given injector only every fourth clock, when that given injector is allowed to transfer its charge sample into its corresponding CCD channel. This decomposition and interleaving of the samples allows subsequent signal processing to proceed at a relatively slow speed.

Since the signal gate operates at the clock frequency for all the CCD injectors, each injector's charge is always equilibrated to the current input signal voltage, regardless of whether its charge will be read out or not. When an injector's charge is not being interrogated, it is allowed to flow back into the input signal channel. The resulting signal from a CCD injector represents the current input signal at a given moment in time. Subsequent processing of the plurality of injector sample streams achieves a reconstruction of the original signal through simple interleaving.

An appreciation of other aims and objectives of the present invention and a more complete and comprehensive understanding of this invention may be achieved by studying the following description of a preferred embodiment and by referring to the accompanying drawings.

BRIEF DESCRIPTION OF THE DRAWINGS

FIG. 8(a) reveals a set of potential well and charge packet diagrams for successive times $t_1$ through $t_5$ which correspond to input voltages and the surface potentials of sampler 17a.

FIG. 8(b) reveals a set of potential well and charge packet diagrams for successive times $t_1$ through $t_7$ which correspond to input voltages and the surface potentials of sampler 17b.

DESCRIPTION OF A PREFERRED EMBODIMENT

Figure 1:
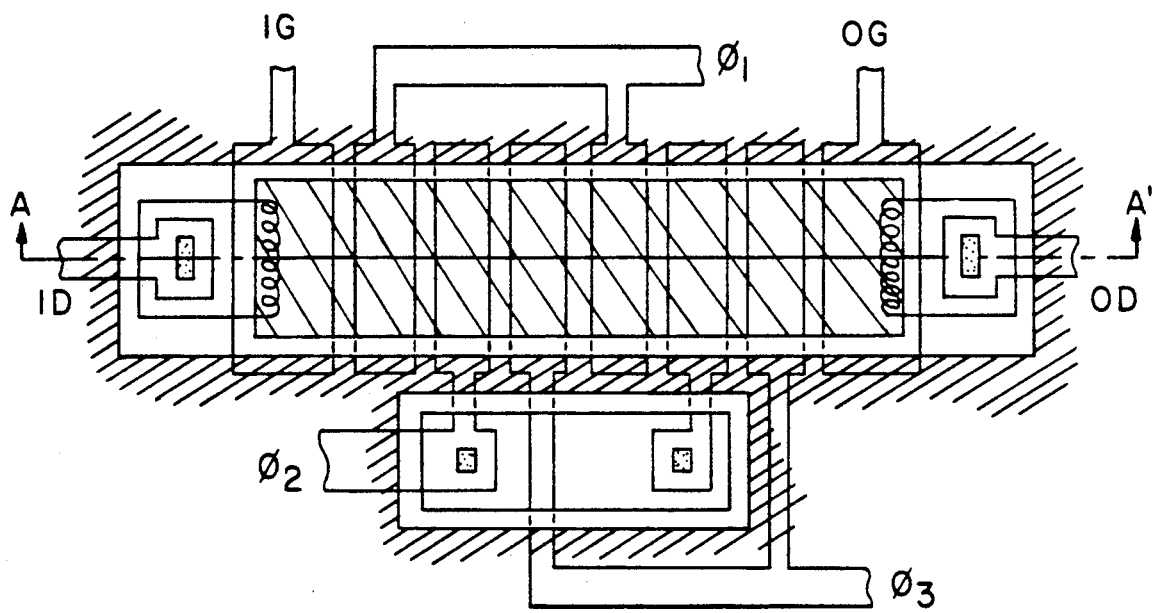
FIG. 1 is an overhead view of a schematic depiction of a conventional charge-coupled device.
Figure 2:
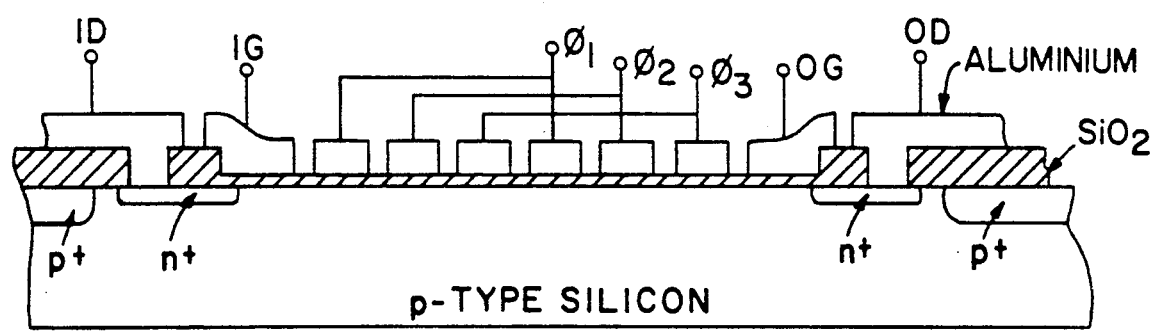
FIG. 2 is a cross-sectional view of the CCD shown in FIG. 1.
Figure 3:
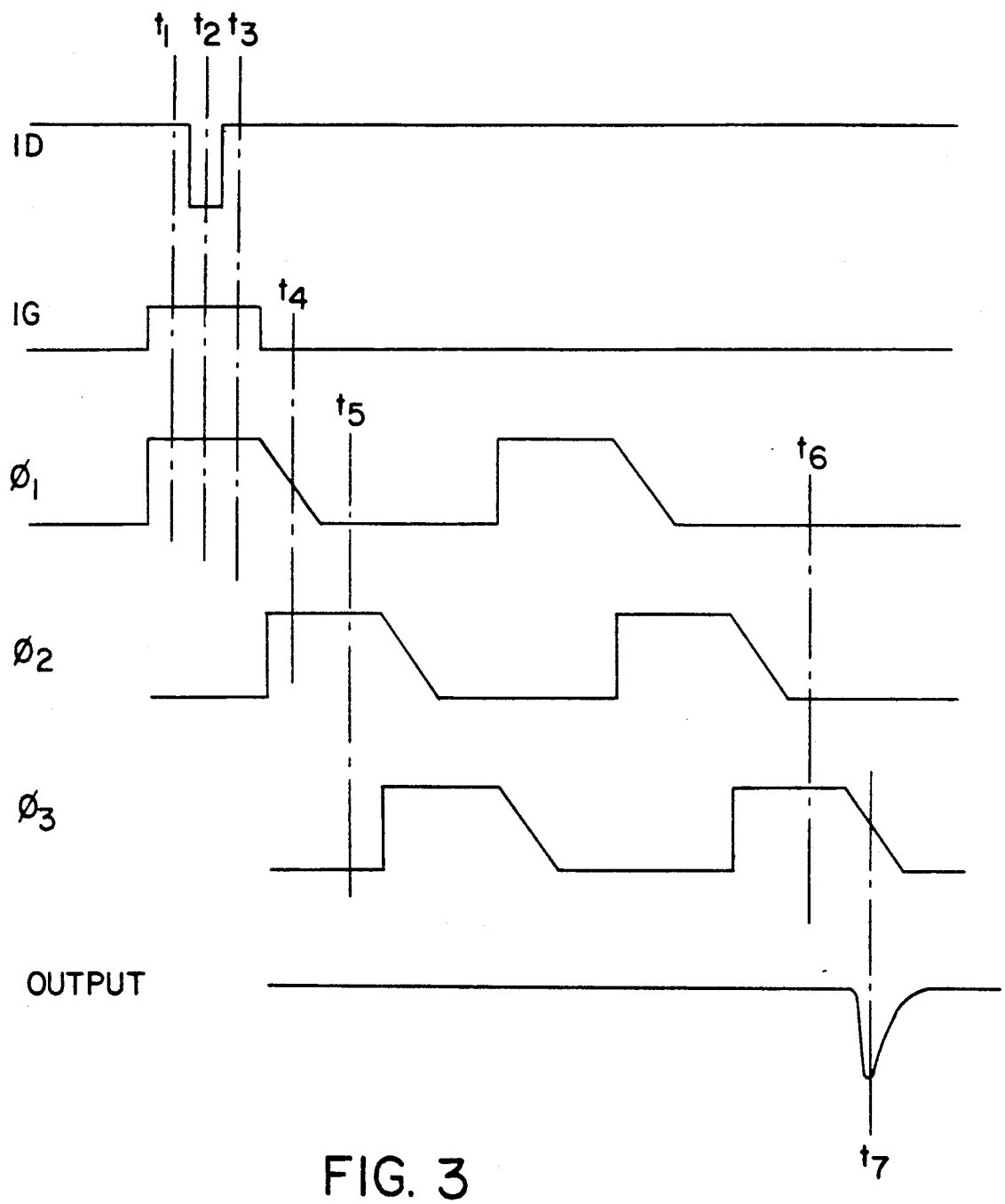
FIG. 3 presents a series of clock waveforms and output signals for the CCD shown in FIG. 1.
Figure 4:
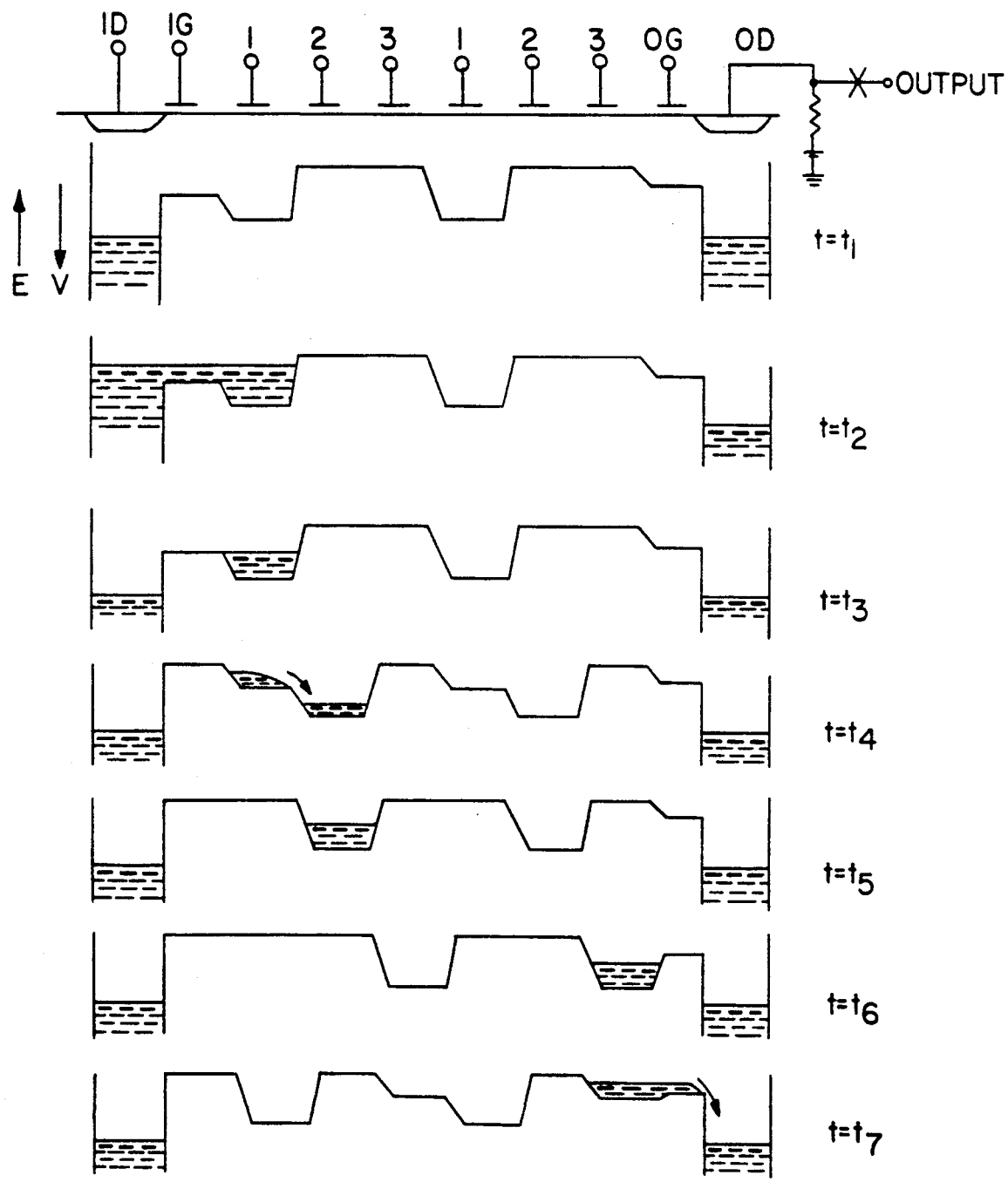
FIG. 4 is a diagram that illustrates potential wells and charge packets in the form of a hydraulic model.
Figure 5:
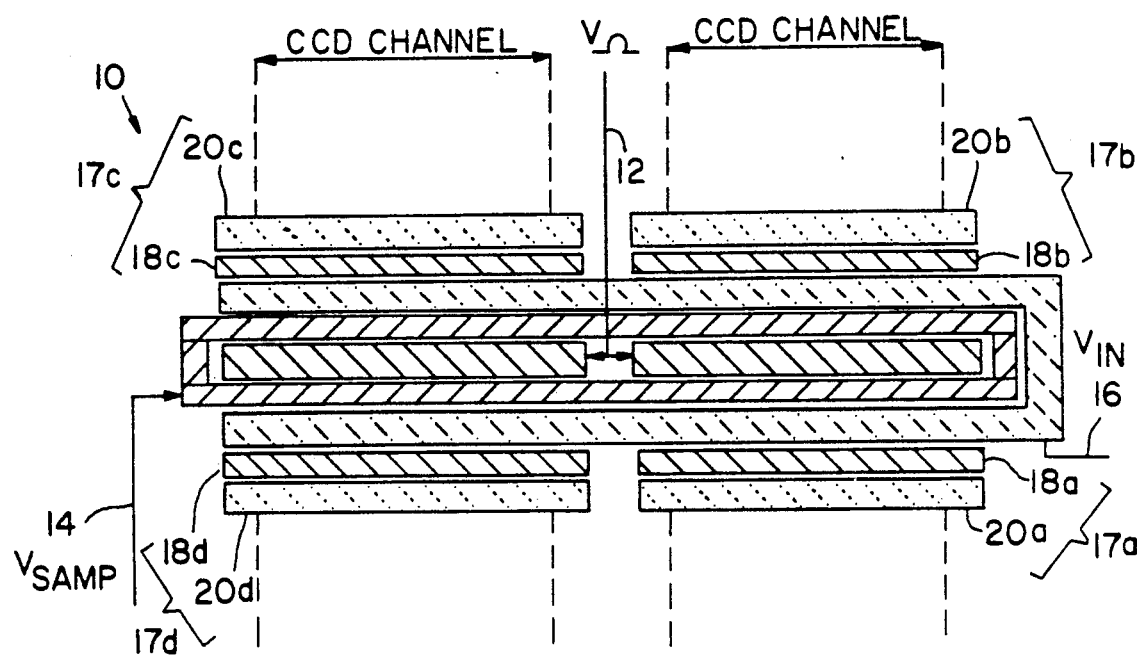
FIG. 5 is a top view of the present invention, which includes four CCD gates surrounding ohmic contacts.
Figure 6:
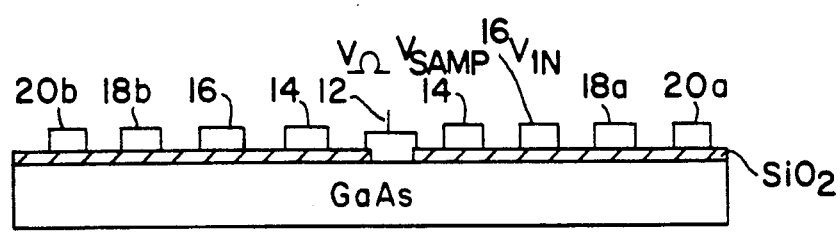
FIG. 6 is a cross-sectional view of the sampler shown in FIG. 5.

FIG. 5 presents a schematic overhead view of a CCD sampling circuit 10 embodying the apparatus and methods of the present invention. FIG. 6 illustrates the same circuit in cross-section. Four sequentially sampling CCD injectors, 17a, 17b, 17c and 17d share a common ohmic contact 12 (the source of electron packets), sampling gate 14 and input gate 16. The cross-sectional view of FIG. 6 represents a slice through injectors 17a and 17b. The entire device may be constructed on a single wafer of gallium arsenide (Ga As) along with drive circuitry and circuitry for further signal processing using techniques familiar to those skilled in the microelectronic arts.

Ohmic contacts 12, placed in the center of the input signal gate 16, supply a constant reservoir of charge for use by the sampling circuit 10. Sampling gate 14, surrounding ohmic contact 12, and in turn surrounded by input signal gate 16, chops the reservoir of charge provided by ohmic contact 12 into uniform and discrete charge packets. The sampling gate 14 when high allows the surface potential under the input gate 16 in all four samplers 17a through 17d to equilibrate with the potential of the ohmic contact 12. When the sampling gate 14 goes low equal charges are isolated under the input gate 16 at the four samples 17a through 17d. These charges are proportional to the potential difference between the ohmic contact 12 and the input gate 16 at the time when the sampling gate 14 went low, thereby ensuring identical sampling by the four samplers 17a through 17d. Each injector or charge output device 17a through 17d is further comprised of two CCD gates: injector 17a has a transfer gate 18a adjacent to one portion of the input signal gate 16, and a storage gate 20a, adjacent to transfer gate 18a. Charge packets move in localized channels outward from the sampling gate 14, to the input signal gate 16, and on to the transfer gate 18a and the storage gate 20a. Injectors 17b through 17d are similarly constructed. Each of the CCD gates described may be fabricated from a conductive layer separated from the semiconductor substrate by a thin dielectric layer (in the present embodiment, an aluminum conductive layer is separated from the Ga As substrate by a thin layer of silicon dioxide ($SiO_2$)).

Figure 8:
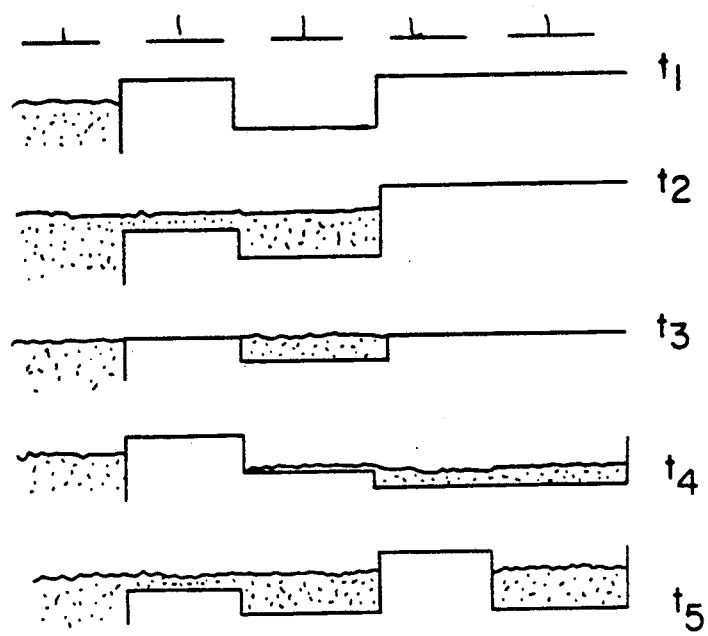
Figure 9:
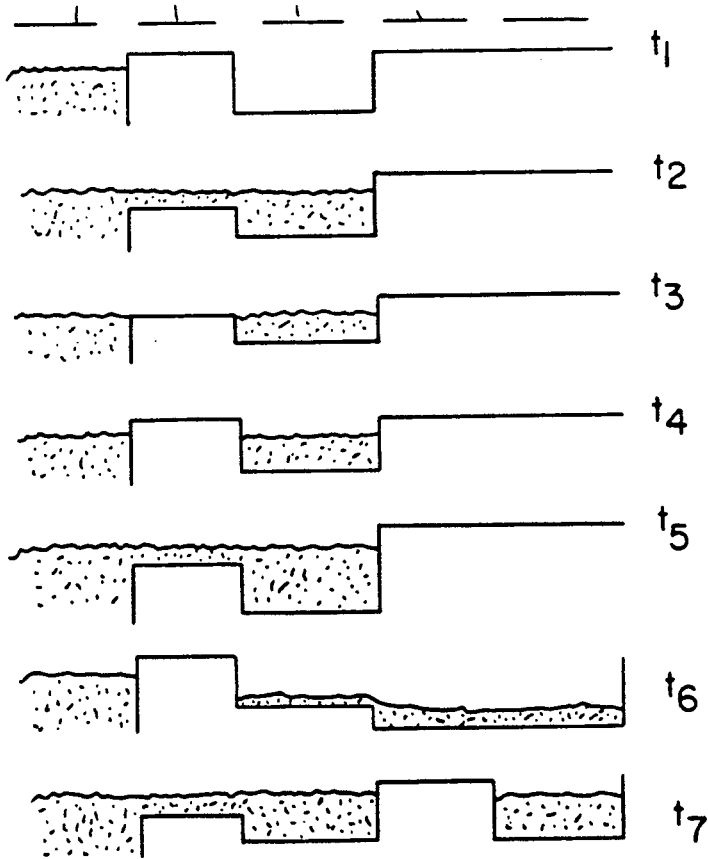
Figure 7:
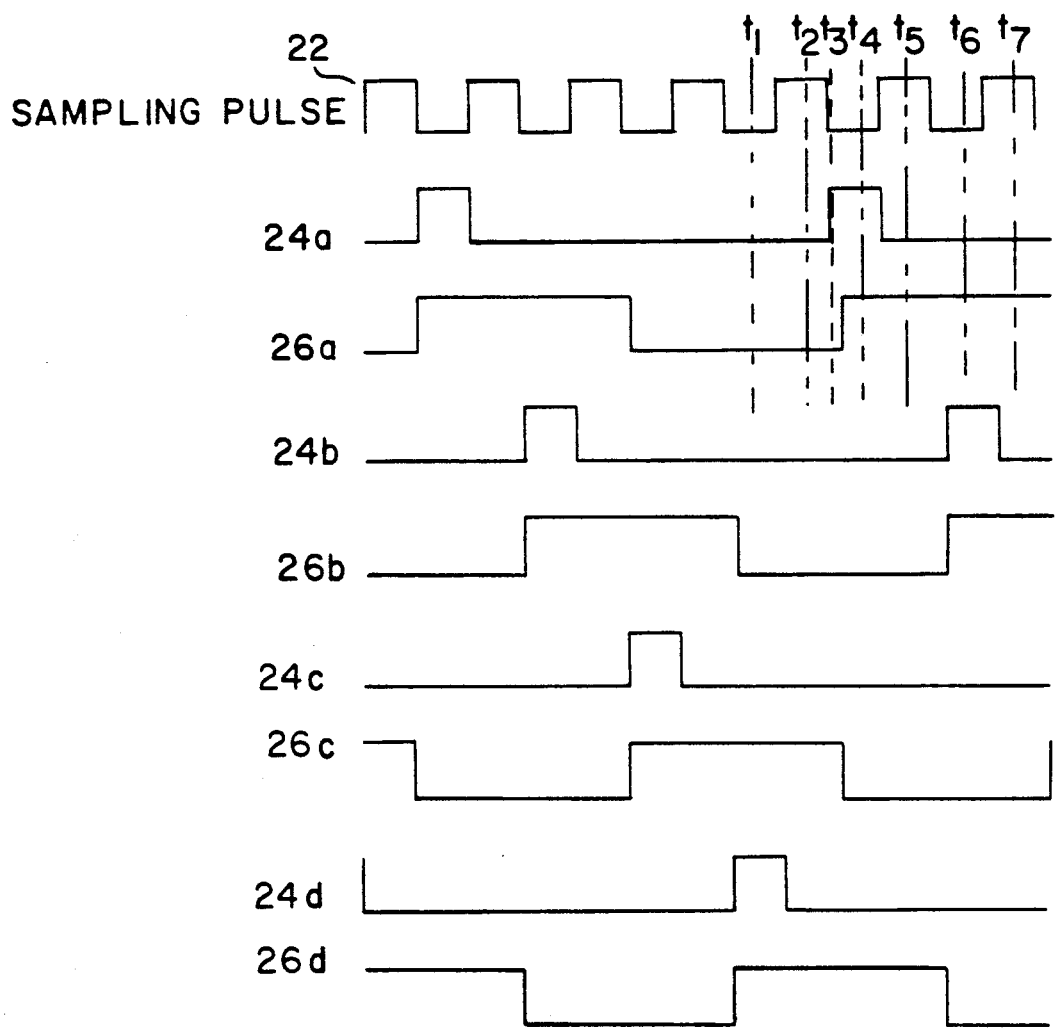
FIG. 7 exhibits a series of timing waveforms that represent the sequence of operation of the present invention.

The operation of the sampling circuit 10 may be understood by referring to FIGS. 5 and 6 in connection with the timing diagram shown in FIG. 7 and the charge transfer diagrams revealed in FIGS. 8(a) and 8(b). The timing diagram of FIG. 7 shows a clocked sampling pulse 22, which may be any uniform periodic waveform. The sampling pulse frequency determines the overall sampling rate of the circuit 10. The sampling frequency for the preferred embodiment here described is 4 gigahertz. The time-varying voltage of the sampling pulse 22 is applied to the sampling gate 14, uniformly varying the potential directly underneath the sampling gate electrode 14. When the sampling pulse's potential goes high, the Fermi level for electrons underneath the electrode 14 goes low, allowing a packet of electrons to flow underneath the sampling gate 14. The combination of the charge reservoir provided by ohmic contacts 12 and the sampling pulse 22 applied to the sampling gate 14 creates a steady and uniform supply of discrete charge packets to the sampling circuit 10.

At time $t_1$, as shown in FIGS. 8(a) and 8(b), the potential of the sampling pulse 22 is low, the Fermi level underneath the sampling gate 14 (represented by Vsamp in FIGS. 8(a) and 8(b)) is high, and no charge flows from the reservoir underneath ohmic contacts 12 (Vohm). At $t_2$, the sampling pulse 22 is high, the Fermi level of Vsamp is low, and charge flows across the sampling gate 14 to the input gate 16 (represented by Vin). The potential level of the input gate 16 (Vin) determines how much charge flows across the sampling gate 14. At $t_3$, the sampling pulse 22 is going low, the Fermi level of Vsamp is rising, and a discrete charge packet remains in the well underneath the input signal gate 16, Vin. The size of the charge packet which remains reflects accurately the instantaneous input voltage applied to the input gate 16. The charge packet is the same for all injectors 17a through 17d (seen by comparing the diagram for $t_3$ in both FIGS. 8(a) and 8(b)).

At time $t_4$, a single clock pulse 24a is applied to the transfer gate 18a of injector 17a, lowering the Fermi level under transfer gate 18a. A longer pulse 26a is simultaneously applied to storage gage 20a, also lowering its Fermi level. The two Fermi levels are shown as $\phi_{18a}$ and $\phi_{20a}$ in FIG. 8(a). Because both Fermi levels have been driven low, the trapped charge underneath input signal gate 16 flows underneath transfer gate 18a, and storage gate 20a. As the pulse 24a returns to its low value, causing the Fermi level underneath the transfer gate to again go high, the charge originally trapped underneath the input signal gate has now moved to and remains stored under storage gate 20a, whose Fermi level is still low and remains low for two full clock cycles. Meanwhile, at time $t_5$, the sampling cycle has repeated itself and charge once again flows to the well located underneath input signal gate 16. The trapped charge under storage gate 20a is available for further transport away from the sampler circuit 10 and for measuring by any conventional means. The trapped charge at time $t_5$ underneath storage gate 20a represents the instantaneous value of the input signal at time $t_3$, when it was originally trapped.

The process for the other injectors 17a through 17d proceeds in substantially the same way. The only difference, as revealed by comparing FIG. 8(b) with FIG. 8(a), consists in the temporal spacing of clock pulses applied to the injector gates. At time $t_2$, FIG. 8(b), charge is also let into the well underneath injector 17b's portion of the input signal gate 16. But at times $t_4$ and $t_5$ the signals applied to transfer gate 18b and to storage gate 20b are still low, leaving the Fermi levels of $\phi_{18b}$ and $\phi_{20b}$ still high. The charge packet underneath the input signal gate, for injector 17b, remains trapped in the well produced by Vin. At time $t_5$, as the sampling pulse 22 again goes high allowing electrons to flow, the trapped charge packet is allowed to flow in or out, depending upon the relative levels of the reservoir under the ohmic contact 12 and the trapped charge packet underneath the input signal gate 16. This inherent equilibration, which occurs at each clock of the sampling pulse 22 for all sampling injectors which were not activated during the preceding cycle, allows efficient interleaving of injectors because no charge samples need to be thrown away or otherwise removed. Instead, the charge sample trapped by the well underneath input signal gate 16 always reflects the current and instantaneous voltage of the input signal.

The process for injector 17b for times $t_6$ and $t_7$ is exactly the same as for the corresponding times $t_4$ and $t_5$ for sampler 17a in FIG. 8(a): the charge packet is transferred from the input signal gate 16 to sampler storage gate 20b. In likewise fashion, injectors 17c and 17d are "fired" in successive cycles, one injector gate each clock cycle. Since the overall sampling pulse 22 governs the interleaving of the separate injector gates 17a through 17d, greater uniformity of interleaving results.

Each data stream from a separate injector comprises charge packets clocked at one fourth the sampling rate. The resulting rate reduction allows subsequent processing of each data stream at a much slower rate. It will be apparent that any number of injectors may be used in a given sampler circuit, to decimate the sampling of an input signal, further reducing the rate of each interleaved data stream. During sebsequent processing, simply recombining the separate data streams regenerates the original signal.

The methods and apparatus for high speed charge-coupled sampling disclosed are applicable to any electronic sampling application. Although the present invention has been described in detail with reference to a particular preferred embodiment, persons possessing ordinary skill in the art to which this invention pertains will appreciate that various modifications and enhancements may be made without departing from the spirit and scope of the claims that follow.

LIST OF REFERENCE NUMERALS

10-High Speed Charge-Coupled Sampler and Rate Reduction Circuit
12-Ohmic contacts
14-Sampling gate
16-Input signal gate
17-Sampler Injector
18-Transfer gate
20-Storage gate
22-Sampling pulse waveform
24-Transfer Gate waveforms
26-Storage Gate waveforms

What is claimed is:
1. A sampler comprising:
a source for providing a supply of charges;
a sampling gate for regulating the amount of said supply of charge from said source; said sampling gate being adjacent to said source;
an input gate for modulating the amount of said supply of charge after said supply of charge emerges from said sampling gate; and
a plurality of sequential charge output gates, each of said sequential charge output gates being adjacent to said input gate, said plurality of sequential charge output gates being capable of conducting a packet of said supply of charge into one of said sequential charge output gates at a time, said plurality comprising at least four of said gates.

2. A sampler as claimed in claim 1, in which said source is an ohmic contact.

3. A sampler as claimed in claim 1, in which said sampling gate substantially surrounds said source.

4. A sampler as claimed in claim 1, in which said input gate substantially surrounds said sampling gate.

5. A sampler as claimed in claim 1, in which said sampling gate provides a cyclical voltage waveform.

6. A sampler as claimed in claim 1, in which said input gate provides a time-varying input voltage waveform.

7. A sampler as claimed in claim 1, in which said sequential charge output gate includes a transfer gate and a storage gate.

8. A method of sampling an input waveform comprising the steps of:
providing a constant supply of charge from a source;
applying a cyclical voltage waveform to a sampling gate to form a plurality of uniform charge packets from said source;
modulating the amount of charge in said charge packets by applying an input voltage waveform to an input voltage gate;
moving said charge packets from said input voltage gate to a single transfer gate of a plurality of transfer gates;
moving said charge packets from said transfer gate to a storage gate; and
reading said charge packets from said storage gate to form a sampled output.

* * * * *